United States Patent
Tomimatsu

(10) Patent No.: US 7,132,738 B2
(45) Date of Patent: *Nov. 7, 2006

(54) SEMICONDUCTOR DEVICE HAVING MULTIPLE SEMICONDUCTOR CHIPS STACKED IN LAYERS AND METHOD FOR MANUFACTURING THE SAME, CIRCUIT SUBSTRATE AND ELECTRONIC APPARATUS

(75) Inventor: Hiroyuki Tomimatsu, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/782,810

(22) Filed: Feb. 23, 2004

(65) Prior Publication Data

US 2004/0183170 A1    Sep. 23, 2004

Related U.S. Application Data

(62) Division of application No. 10/327,968, filed on Dec. 26, 2002, now Pat. No. 6,727,574.

(30) Foreign Application Priority Data

Dec. 28, 2001    (JP) .............................. 2001-400229

(51) Int. Cl.
*H01L 23/02*    (2006.01)
(52) U.S. Cl. ...................... 257/686; 257/777; 257/787
(58) Field of Classification Search ................ 257/686, 257/777, 778, 780, 787
See application file for complete search history.

(56) References Cited

U.S. PATENT DOCUMENTS

| | | | |
|---|---|---|---|
| 5,422,435 A | 6/1995 | Takiar et al. | |
| 6,104,084 A | 8/2000 | Ishio et al. | 257/666 |
| 6,161,753 A | 12/2000 | Tsai et al. | 228/180.5 |
| 6,413,797 B1 | 7/2002 | Oka et al. | |
| 6,441,472 B1 | 8/2002 | Hatauchi et al. | 257/666 |
| 6,483,178 B1 * | 11/2002 | Chuang | 257/672 |
| 6,522,015 B1 * | 2/2003 | Glenn et al. | 257/777 |
| 6,627,981 B1 | 9/2003 | Shibata | 257/678 |
| 6,731,011 B1 * | 5/2004 | Verma et al. | 257/777 |
| 6,900,528 B1 * | 5/2005 | Mess et al. | 257/686 |
| 2002/0158316 A1 | 10/2002 | Lee et al. | 257/676 |
| 2003/0042621 A1 | 3/2003 | Chen et al. | 257/784 |
| 2003/0199118 A1 | 10/2003 | Park et al. | 438/106 |

FOREIGN PATENT DOCUMENTS

| | | |
|---|---|---|
| JP | A 06-37250 | 2/1994 |
| JP | A 08-213545 | 8/1996 |
| JP | A 10-256469 | 9/1998 |
| JP | A 11-135714 | 5/1999 |
| JP | A 2000-114452 | 4/2000 |
| JP | A 2000-124392 | 4/2000 |
| JP | A 2001-177050 | 6/2001 |

* cited by examiner

*Primary Examiner*—Hoai Pham
(74) *Attorney, Agent, or Firm*—Oliff & Berridge, PLC

(57) ABSTRACT

The invention enhances reliability and achieves higher speeds for semiconductor devices with a stacked structure. A semiconductor device includes a die pad, a plurality of semiconductor chips stacked on one surface of the die pad, leads extending toward the die pad, first wires that are bonded to first pads of a first semiconductor chip among the plurality of semiconductor chips and to second pads of a second semiconductor chip among the plurality of semiconductor chips, second wires that are bonded to the leads and to the first pads or the second pads, and a sealing material that seals the plurality of semiconductor chips and exposes another surface of the die pad.

6 Claims, 6 Drawing Sheets

SEMICONDUCTOR DEVICE HAVING MULTIPLE SEMICONDUCTOR CHIPS STACKED IN LAYERS AND METHOD FOR MANUFACTURING THE SAME, CIRCUIT SUBSTRATE AND ELECTRONIC APPARATUS

This is a Division of application Ser. No. 10/327,968 filed Dec. 26, 2002, now U.S. Pat. No. 6,727,574. The entire disclosure of the prior application is hereby incorporated by reference herein in its entirety.

BACKGROUND OF THE INVENTION

1. Field of Invention

The present invention relates to semiconductor devices, methods for manufacturing the same, circuit substrates and electronic devices.

2. Description of Related Art

The related art includes semiconductor devices having a stacked structure that realize high density mounting. For example, a related art configuration includes a plurality of semiconductor chips stacked one on top of the other on a die pad of a lead frame, in which the semiconductor chips are electrically connected to leads by wires. In this case, electrodes of each of the semiconductor chips are directly bonded to the leads by the wires.

However, the distance between the electrodes of the semiconductor chips and the leads is greater than the distance between the electrodes of the different semiconductor chips. Also, when the wires are routed around from the leads as starting points to each of the semiconductor chips, the entire length of the wires becomes long. For this reason, the resistance of the wires becomes greater, which has sometimes prevented enhancements toward higher speeds. Also, since the wires are long, they are therefore apt to become short-circuited with other wires.

SUMMARY OF THE INVENTION

The present invention addresses or solves the problems described above, and enhances reliability and achieves higher speeds for semiconductor devices with a stacked structure.

A semiconductor device in accordance with the present invention includes:

a die pad;

a plurality of semiconductor chips stacked on one surface of the die pad;

a lead extending toward the die pad;

a first wire that is bonded to a first pad of a first semiconductor chip among the plurality of semiconductor chips and to a second pad of a second semiconductor chip among the plurality of semiconductor chips;

a second wire that is bonded to the lead and to one of the first pad and the second pad; and a sealing material that seals the plurality of semiconductor chips and exposes another surface of the die pad.

In accordance with the present invention, the first wire is bonded to the first pad of the first semiconductor chip and the second pad of the second semiconductor chip. In other words, the first and second semiconductor chips are directly electrically connected to each other by the first wire. For this reason, the entire length of the wires (the length of the first and second wires combined) can be made to be shorter compared to the case where wires are lead out from the leads as starting points to the first and second pads. As a result, the material cost for the wires can be reduced, and semiconductor devices can achieve higher speeds since the entire wire resistance can be lowered. Also, since the overall wire length is short, the first and second wires are prevented or substantially prevented from becoming short-circuited.

In the semiconductor device, the second semiconductor chip may be mounted on the first semiconductor chip, and the second wire may be bonded to the lead and to the second pad.

In the semiconductor device, the second wire may be lead out to pass above the first wire.

As a result, the first and second wires are prevented or substantially prevented from becoming short-circuited.

In the semiconductor device, the second wire may be lead out to traverse the first wire.

As a result, the second wire can be routed around freely without being limited to configurations in which the first wire is routed around.

In the semiconductor device, the second wire may be overlapped with and bonded to the first wire on the second pad.

As a result, even when the second pad region is narrow, a plurality of wires can be bonded to the second pad.

In the semiconductor device, the second wire may include a ball formed on a tip thereof, and the ball may be press-bonded to the first wire.

As a result, by press-bonding the ball on the second wire to a part of the first wire on the second pad, the bonded section of the first wire and the second wire can be reinforced.

In the semiconductor device, the second wire may be bonded to the second pad that is bonded to the first wire, while avoiding a bonded section of the first wire.

As a result, for example, the first and second wires do not have to be overlapped with each other, and therefore the first and second wires can be securely bonded to the second pad.

In the semiconductor device, the second semiconductor chip may include a plurality of the second pads, the plurality of the second pads may include a group of pads that are electrically connected to one another by a wiring, the first wire may be bonded to one of the group of pads, and the second wire may be bonded to another of the group of pads.

As a result, for example, the first and second wires do not have to be overlapped with each other, and therefore the first and second wires can be securely bonded to the second pad.

In the semiconductor device, the second pad may be provided with a bump, and the first wire and the second wire may be bonded to the second pad through the bump.

In the semiconductor device, the second semiconductor chip may be mounted on the first semiconductor chip, and the second wire may be bonded to the lead and to the first pad.

In the semiconductor device, the first semiconductor chip may be a memory, and the second semiconductor chip may be a microprocessor.

A circuit substrate in accordance with the present invention mounts the aforementioned semiconductor device.

An electronic device in accordance with the present invention includes the aforementioned semiconductor device.

A method for manufacturing a semiconductor device in accordance with the present invention includes:
(a) stacking a plurality of semiconductor chips on one surface of a die pad;
(b) bonding a first wire to a first pad of a first semiconductor chip among the plurality of semiconductor chips and to a second pad of a second semiconductor chip among the plurality of semiconductor chips;
(c) bonding a second wire to a lead that extends toward the die pad and to one of the first pad and the second pad; and
(d) sealing the plurality of semiconductor chips and exposing another surface of the die pad.

In accordance with the present invention, the first wire is bonded to the first pad of the first semiconductor chip and the second pad of the second semiconductor chip. In other words, the first and second semiconductor chips are directly, electrically connected to each other by the first wire. For this reason, the entire length of the wires (the length of the first and second wires combined) can be made to be shorter compared to the case where wires are lead out from the leads as starting points to the first and second pads. As a result, the material cost for the wires can be reduced, and semiconductor devices can achieve higher speeds since the entire wire resistance can be lowered. Also, since the overall wire length is short, the first and second wires are prevented or substantially prevented from becoming short-circuited.

In the method for manufacturing a semiconductor device, in step (a), the second semiconductor chip may be mounted on the first semiconductor chip, and
in step (c), the second wire may be bonded to the lead and the second pad.

In the method for manufacturing a semiconductor device, in step (c), the second wire may be lead out to pass over the first wire.

As a result, the first and second wires are prevented or substantially prevented from becoming short-circuited.

In the method for manufacturing a semiconductor device, in step (c), the second wire may be lead out to traverse the first wire.

As a result, the second wire can be routed around freely without being limited to configurations in which the first wire is routed around.

In the method for manufacturing a semiconductor device, in step (c), the second wire may be overlapped with and bonded to the first wire on the second pad.

As a result, even when the second pad region is narrow, a plurality of wires can be bonded to the second pad.

In the method for manufacturing a semiconductor device, in step (c), a ball may be formed on a tip portion of the second wire, and the ball may be press-bonded to the first wire.

As a result, by press-bonding the ball on the second wire to a part of the first wire on the second pad, the bonded section of the first wire and the second wire can be reinforced.

In the method for manufacturing a semiconductor device, in steps (b) and (c), the first wire and the second wire may be bonded to the second pad without forming balls.

In the method for manufacturing a semiconductor device, in step (c), the second wire may be bonded to the second pad that is bonded to the first wire, while avoiding a bonded section of the first wire.

As a result, for example, the first and second wires do not have to be overlapped with each other, and therefore the first and second wires can be securely bonded to the second pad.

In the method for manufacturing a semiconductor device, the second semiconductor chip may include a plurality of the second pads,
the plurality of the second pads may include a group of pads that are electrically connected to one another by a wiring,
in step (b), the first wire may be bonded to one of the group of pads, and
in step (c), the second wire may be bonded to another of the group of pads.

As a result, for example, the first and second wires do not have to be overlapped with each other, and therefore the first and second wires can be securely bonded to the second pad.

In the method for manufacturing a semiconductor device, in steps (b) and (c),
the second pad may be provided with a bump, and
the first wire and the second wire may be bonded to the second pad through the bump.

DETAILED DESCRIPTION OF PREFERRED EMBODIMENTS

Figure 1:
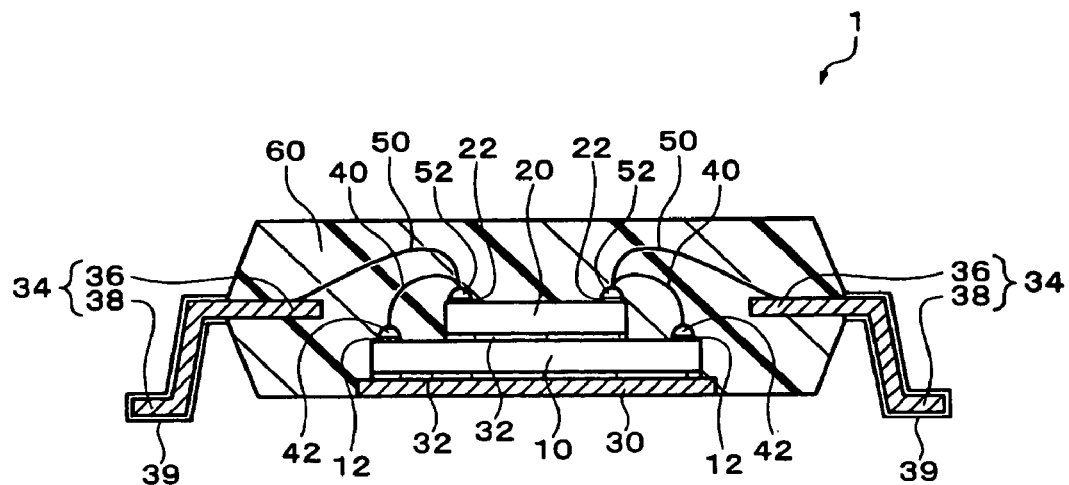
FIGS. 1(A) and 1(B) are schematics that show a semiconductor device in accordance with a first embodiment of the present invention.
Figure 1:
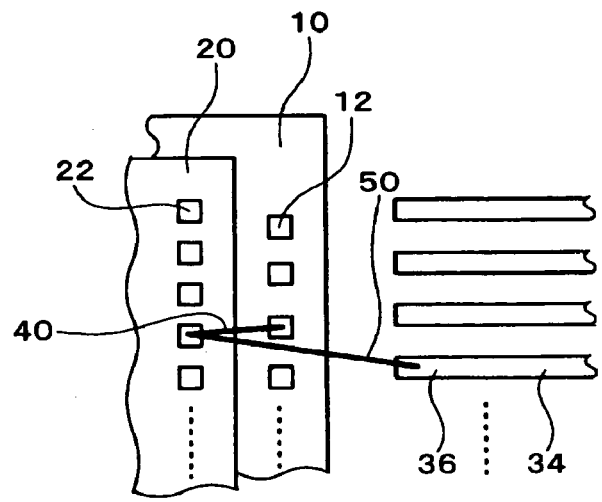

Embodiments of the present invention are described below with reference to the accompanying drawings. However, the present invention is not limited to the exemplary embodiments described below.

(First Embodiment)

Referring to FIG. 1(A)–FIG. 6(C), a semiconductor device in accordance with a first embodiment and a method for manufacturing the same will be described.

As shown in FIG. 1(A), the semiconductor device in accordance with the present embodiment includes multiple semiconductor chips, a die pad 30, leads 34, first and second wires 40 and 50, and sealing material 60. FIG. 1(B) is a plan view of part of the semiconductor device that shows a configuration of the first and second wires 40 and 50.

The multiple semiconductor chips include first and second semiconductor chips 10 and 20. In FIG. 1(A), two semiconductor chips (the first and second semiconductor chips 10 and 20) are stacked in layers. Alternatively, three or more semiconductor chips can be stacked in layers. In such a case, the first and second semiconductor chips 10 and 20 correspond to two of the multiple semiconductor chips.

The first semiconductor chip 10 may often have a rectangular solid configuration. Circuit elements (such as transistors) are formed in one of faces of the first semiconductor chip. The first semiconductor chip 10 includes one or multiple first pads 12. The first pad 12 may be a rectangular—(for example, square) shaped pad, or a circular—(for example, round) shaped pad. The first pad 12 may be formed into a thin, flat configuration with aluminum metal or copper metal. The first pad 12 may often be formed on the side of the surface where circuit elements are provided. The first pad 12 may often be arranged along at least one of the sides (for example, along opposing two or four sides) of a face of the first semiconductor chip 10. Also, a passivation film (not shown) is formed on the first semiconductor chip 10 except at least one part of the first pad 12. The passivation film is formed from, for example, $SiO_2$, SiN, polyimide resin or the like.

The second semiconductor chip 20 may be a similar shape as the first semiconductor chip 10. When the second semiconductor chip 20 is mounted on the first semiconductor chip 10, the outer shape of the second semiconductor chip 20 may preferably be smaller than the outer shape of the first semiconductor chip 10. The second semiconductor chip 20 has one or multiple second pads 22. For the other structure, the above description for the first semiconductor chip 10 can be applied.

The first and second semiconductor chips 10 and 20 are stacked in layers on the die pad 30. The die pad 30 is formed through processing copper or iron plate material, and generally in a rectangular configuration. In FIG. 1(A), the first semiconductor chip 10 is mounted on the die pad 30, and the second semiconductor chip 20 is mounted on the first semiconductor chip 10. In this case, the first semiconductor chip 10 is face-up bonded to the die pad 30, and the second semiconductor chip 20 is face-up bonded to the first semiconductor chip 10. The second semiconductor chip 20 is mounted on the first semiconductor chip 10 in a manner to avoid the multiple first pads 12. The second semiconductor chip 20 may be mounted generally in the center of the first semiconductor chip 10.

In FIG. 1(A), the first semiconductor chip 10 is adhered to the die pad 30 by adhesive 32. The adhesive 32 may be present in a gap between the first and second semiconductor chips 10 and 20. A thermosetting resin may be used as the adhesive 32, or a material having a high heat transfer rate, such as metal paste (silver paste or the like), may be used. By doing so, the heat generated during operation of the first and second semiconductor chips 10 and 20 can be readily emanated through the die pad 30.

Multiple leads 34 extend toward the die pad 30. The leads 34 may often be formed from the same material as that of the die pad 30. The leads 34 include inner leads 36 and outer leads 38. The inner leads 36 are portions that are to be sealed by sealing material 60 (to be described below), and the outer leads 38 are portions that are lead out the sealing material 60, and are used for electrical connection with external elements. The outer leads 38 are bent in a specified shape (a gull-wing shape in FIG. 1(A)). Metal coating 39 of brazing material (for example, solder) or zinc may be formed on the outer leads 38.

The first pads 12 and the second pads 22 are electrically connected to one another by first wires 40. More specifically, one end section of the first wire 40 is bonded to the first pad 12, and the other end section of the first wire 40 is bonded to the second pad 22. The first wires 40 may be formed from metal, such as, for example, gold, aluminum or copper.

Bumps 42 may be provided on the first pads 12. The material of the bumps 42 may preferably be the same material of the first wires 40 to be bonded, and may be, for example, gold. The bumps 42 may be part of the first wires 40. In other words, the bumps 42 may be formed from balls that are formed at tip sections of the first wires 40 and squashed. By forming the bumps 42 at the first pads 12, the bonding strength between the first wires 40 and the first pads 12 can be enhanced.

In the present embodiment, the second pads 22 and the leads 34 (more specifically, the inner leads 36) are electrically connected to one another by second wires 50. More specifically, one end section of the second wire 50 is bonded to the second pad 22, and the other end section of the second wire 50 is bonded to the lead 34. The second wires 50 may be formed from the same material as that of the first wires 40.

Bumps 52 may be provided on the second pads 22. The material of the bumps 52 may preferably be the same material of the first and second wires 40 and 50 to be bonded, and may be, for example, gold. The bumps 52 may be part of the second wires 50. In other words, the bumps 52 may be formed from balls that are formed at tip portions of the second wires 50 and squashed. By forming the bumps 52 at the second pads 22, the bonding strength between the second wires 50 and the second pads 22 can be enhanced.

Alternatively, the bumps 52 may be part of the first wires 40. Also, bumps may be provided on the leads 34 at their bonding sections with the second wires 50 (see FIG. 6(C)). By forming the bumps on the leads 34, the bonding strength between the second wires 50 and the leads 34 can be enhanced.

As shown in FIG. 1(A), the second wires 50 are lead out above the first wires 40. In other words, loops of the first wires 40 are lead out in a manner not to exceed loops of the second wires 50. By so doing, the first and second wires 40 and 50 can be prevented or substantially presented from becoming short-circuited.

In the example shown in FIG. 1(A) and FIG. 1(B), the first and second wires 40 and 50 are overlapped with one another on and bonded to the second pads 22. In accordance with this structure, the leads 34 and the first pads 12 can be electrically connected through the first and second wires 40 and 50. Moreover, even when the second pads 22 are provided in a narrow region, the first and second wires 40 and 50 can be bonded to the second pads 22. The second wires 50 may be overlapped on the first wires 40. By so doing, the second wires 50 can be readily lead out above the first wires 40.

As shown in FIG. 1(A), the sealing material 60 seals the multiple semiconductor chips. More specifically, the sealing material 60 seals the first and second semiconductor chips 10 and 20, the first and second wires 40 and 50, and the inner leads 36. The sealing material 60 may often be resin (for example, epoxy resin). The sealing material 60 exposes part of the die pad 30. More specifically, the sealing material 60 exposes a surface of the die pad 30 opposite to its surface where the first and second semiconductor chips 10 and 20 are mounted. By so doing, the heat generated during operation of the first and second semiconductor chips 10 and 20 can be readily emanated through the die pad 30.

Figure 2:
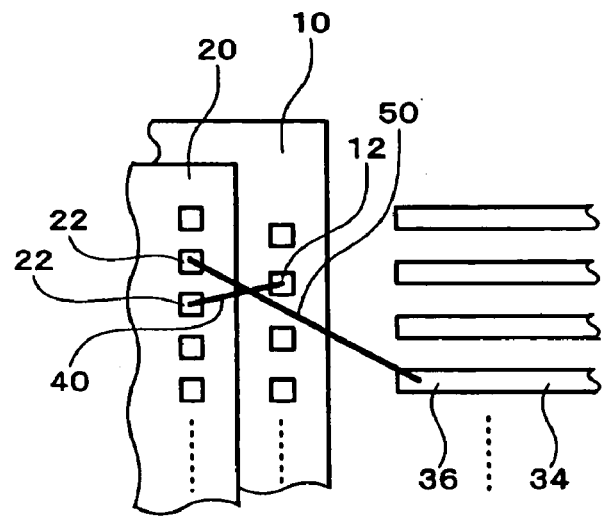
FIG. 2 is a schematic that shows a semiconductor device in accordance with the first embodiment of the present invention.

As shown in FIG. 2, the second wire 50 may be lead out in a manner to traverse the first wire 40. More specifically, in a plan view of the first and second semiconductor chips 10 and 20, the first and second wires 40 and 50 may cross each other. In this case, the first and second wires 40 and 50 are disposed in a manner not to contact with each other. For example, the second wire 50 may be lead out above the first wire 40. In accordance with this structure, the second wire 50 can be routed around freely without being restricted by the configuration in which the first wire 40 is routed. In other words, the positions of the first pads 12, second pads 22 and leads 34 can be freely designed without being limited by the configuration in which the first and second wires 40 and 50 are routed.

The multiple semiconductor chips may include, for example, a variety of memories, such as a flash memory, SRAM (Static RAM) and DRAM (Dynamic RAMs), or a microprocessor, such as MPU (Micro Processor Unit) and MCU (Micro Controller Unit). For example, the first and second semiconductor chips 10 and 20 may be a combination of a memory and a microprocessor, or memories (a flash memory and an SRAM, SRAMs, or DRAMs). In the example shown in FIG. 1(A), the first semiconductor chip 10 is a memory (for example, a flash memory), and the second semiconductor chip 20 is a microprocessor.

Figure 3:
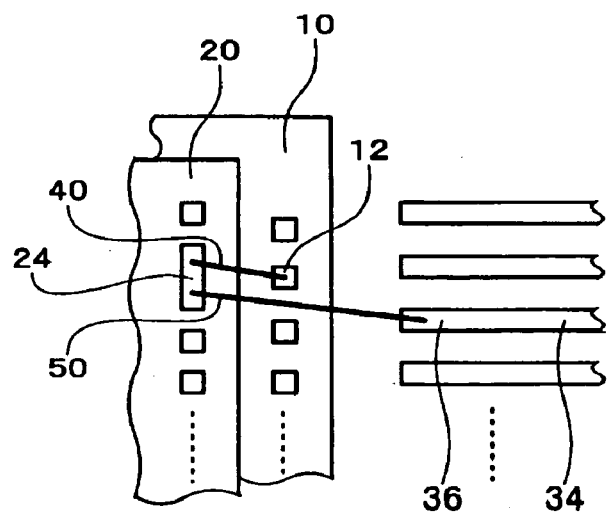
FIG. 3 is a schematic that shows a semiconductor device in accordance with an exemplary modification of the first embodiment.

FIG. 3 shows an exemplary modification of the semiconductor device in accordance with the present embodiment. In the present example, the second semiconductor chip 20 includes one or multiple (one in FIG. 3) second pads 24. The first and second wires 40 and 50 are bonded to the second pad 24 in a manner that they do not overlap with each other. More specifically, the first wire 40 is bonded to part of the second pad 24, and the second wire 50 is bonded to another part of the second pad 24 at a location that avoids the bonding section of the first wire 40. In other words, in a plan view of one of the second pads 24, the bonding sections of the first and second wires 40 and 50 are arranged side by side. By this, the first and second wires 40 and 50 do not need to be overlapped with each other, such that the first and second wires 40 and 50 can be securely bonded to the second pads 24. As shown in FIG. 3, the second pad 24 may have an outer shape with an area that is greater than an outer shape of each of the other pads formed on the second semiconductor chip 20. For example, the second pad 24 may be a rectangle with a shorter side equivalent to one side of a square shape of each of the other pads.

Figure 4:
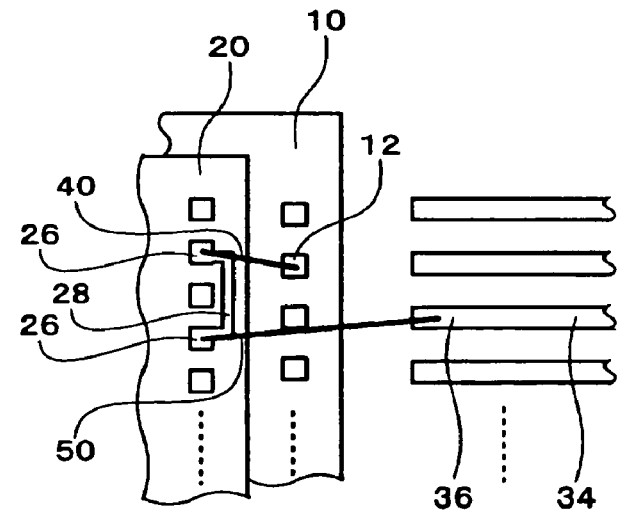
FIG. 4 is a schematic that shows a semiconductor device in accordance with an exemplary modification of the first embodiment.
Figure 5:
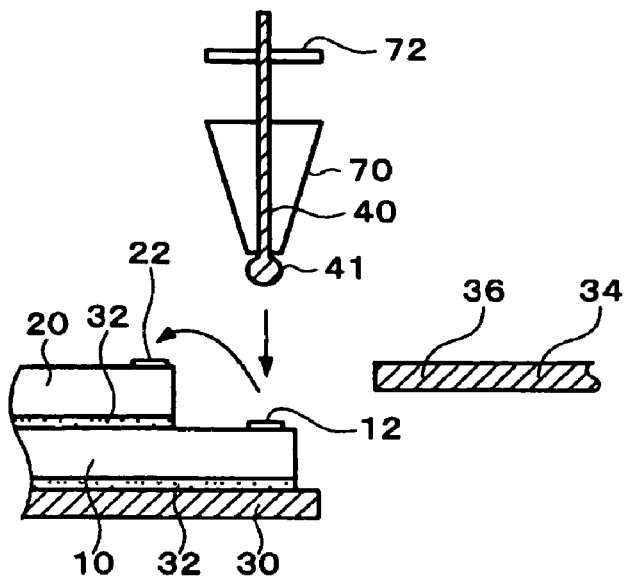
FIGS. 5(A)–5(C) are schematics that show a method for manufacturing semiconductor devices in accordance with the first embodiment.
Figure 5:
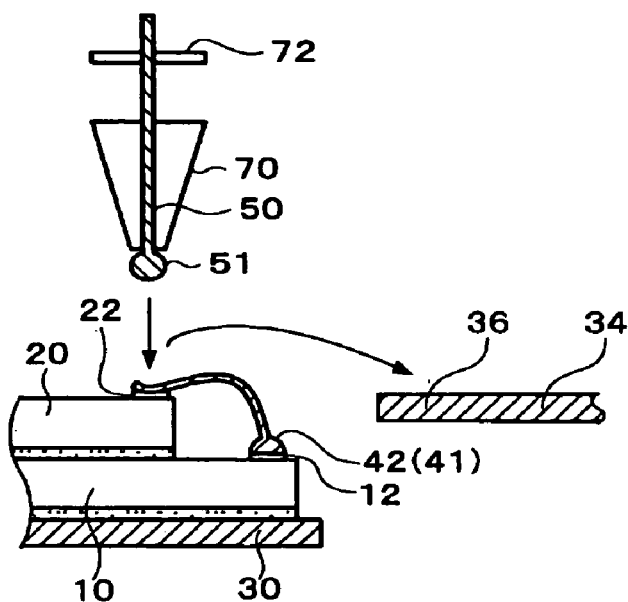
Figure 5:
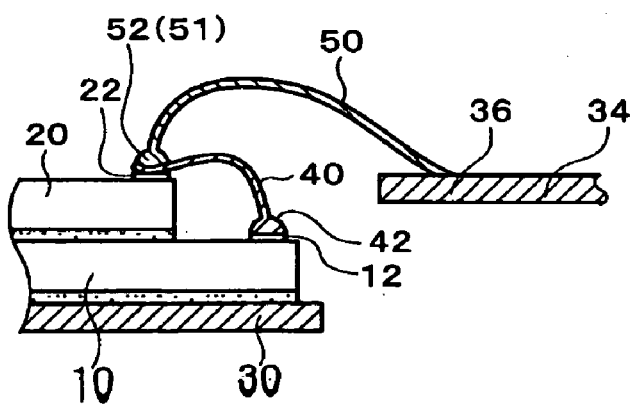
Figure 6:
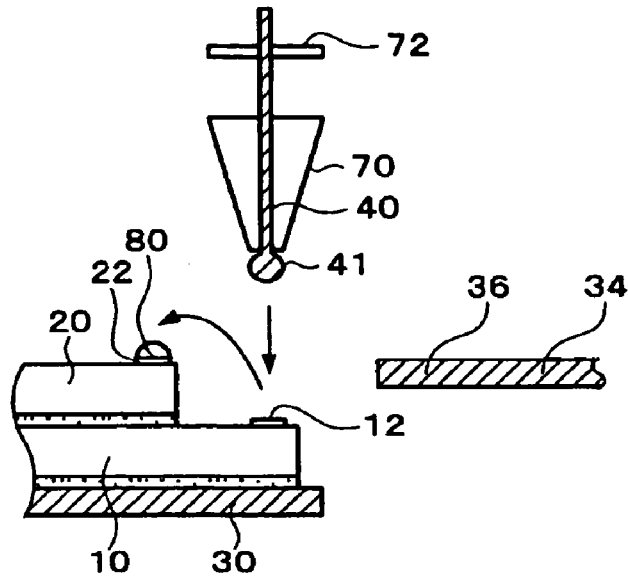
FIGS. 6(A)–6(C) are schematics that show a method for manufacturing semiconductor devices in accordance with an exemplary modification of the first embodiment.
Figure 6:
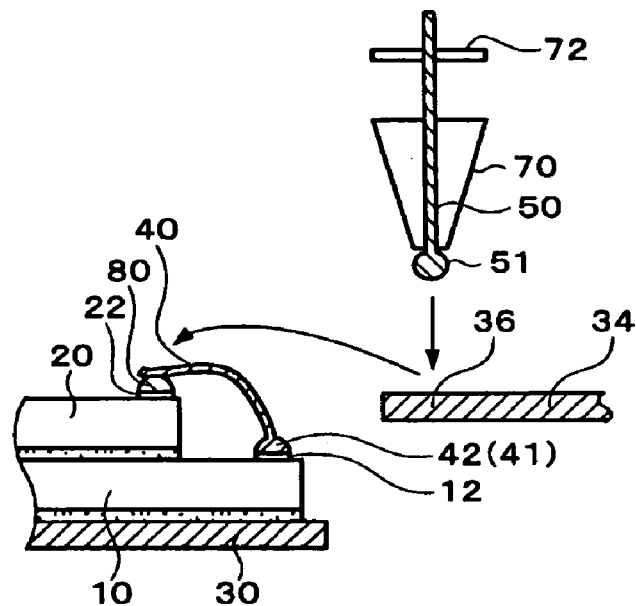
Figure 6:
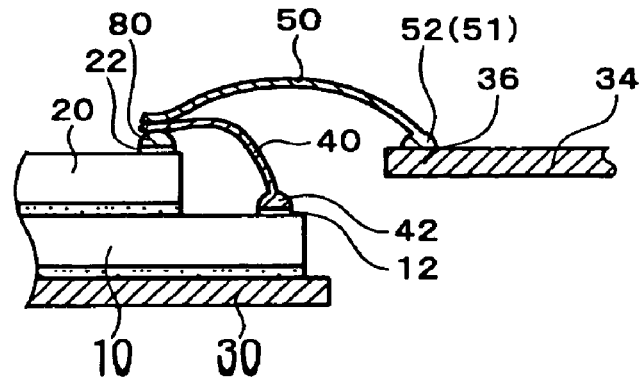

FIG. 4 shows another exemplary modification of the semiconductor device in accordance with the present embodiment. In the present example, the second semiconductor chip 20 includes a group of (two in FIG. 4) pads 26 that are electrically connected by a wiring 28. The first wire 40 is bonded to one of the group of pads 26, and the second wire 50 is bonded to another one of the group of pads 26. In accordance with this structure, the first and second wires 40 and 50 do not have to be overlapped with each other, and therefore the first and second wires 40 and 50 can be securely bonded to the second pads 22.

The wiring 28 is formed on a face of the second semiconductor chip 20 where the group of pads 26 are formed. The wiring 28 may be formed together with the group of pads 26 in the process of manufacturing the second semiconductor chip 20. In this case, the wiring 28 may be formed the same material (for example, aluminum metal or copper metal) as that of the group of pads 26. As shown in FIG. 4, another pad (for example, the second pad 22) may be formed between the pads in the group of pads 26. In the present example, since the pads are electrically connected to one another, wires do not have to be lead out from all of the corresponding pads 26 in the group to the first semiconductor chip 10 and to the lead 34. Therefore, the number of the entire wires can be reduced.

In accordance with the present embodiment, the first wires 40 are bonded to the first pads 12 of the first semiconductor chip 10 and to the second pads 22 of the second semiconductor chip 20. In other words, the first wires 40 are bonded to the first pads 12 of the first semiconductor chip 10 and to the second pads 22 of the second semiconductor chip 20. In other words, the first and second semiconductor chips 10 and 20 are directly, electrically connected to one another by the first wires 40. For this reason, the entire length of the wires (the length of the first and second wires 40 and 50 combined) can be made to be shorter compared to the case where wires are lead out from the leads 34 as starting points to the first and second pads 12 and 22. As a result, the material cost for the wires can be reduced, and semiconductor devices can achieve higher speeds since the entire wire resistance can be lowered. Also, since the overall wire length is short, the first and second wires 40 and 50 are prevented or substantially presented from becoming short-circuited.

Next, descriptions are provided as to a method for manufacturing semiconductor devices in accordance with an embodiment of the present invention. FIGS. 5(A) through 6(C) show portions of the method for manufacturing semiconductor devices (wire bonding process).

First, a die bonding process is conducted. More specifically, first and second semiconductor chips 10 and 20 are mounted on a die pad 30. For example, by using adhesive 32, the die pad 30 and the first semiconductor chip 10 may be adhered, and the first semiconductor chip 10 and the second semiconductor chip 20 may be adhered.

Next, a wire bonding process is conducted. For example, first pads 12 and second pads 22 are electrically connected by wires, and the second pads 22 and inner leads 36 of leads 22 are electrically connected by wires. In the wire bonding process, as indicated in FIGS. 5(A)–6(C), a nail head method may be employed. Alternatively, a wedge method, which does not form balls at tip portions, may be employed.

As indicated in FIG. 5(A), a capillary 70 is disposed on the side of a face of the first semiconductor chip 10 where the first pads 12 are formed. A first wire 40 (which is a conductive line that becomes a first wire) is passed through the capillary 70. A ball 41 is formed on the first wire 40 outside the capillary 70. The ball 41 may be formed at a tip of the first wire 41 by, for example, a high voltage electrical discharge by an electric torch. Then, a damper 72 is released to lower the capillary 70, thereby pressing the ball 41 against the first pad 12. While the ball 41 is pressed against the first pad 12 under a constant pressure to perform a contact bonding, ultrasonic or heat is applied. As a result, the bump 42 is formed on the first pad 12, and the first wire 40 is bonded to the first pad 12 (i.e., first bonding).

Then, the damper 72 is closed to retain the first wire 40, and the capillary 70 and the damper 72 are simultaneously controlled, as indicated in FIG. 5(A), to make a loop on the first wire 40. Then, a part of the first wire 40 is pressed against the second pad 22 to perform a contact bonding with the second pad 22, thereby bonding the first wire 40 to the second pad 22 (i.e., second bonding). In other words, the first wire 40 is bonded to the second pad 22 without forming a ball. For example, when the diameter of the first wire 40 is about 25–30 μm, a pressure of about 0.20–0.30N is applied to squash the first wire 40 to have a width equivalent to about 1.5–2 times the diameter. In this case, ultrasonic or heat is applied when performing the contact bonding.

As indicated in FIG. 5(A), when the position of the first bonding (for example, the position of the first pad 12) is lower than the position of the second bonding (for example, the position of the second pad 22), the loop height of the first wire 40 can be made lower, compared to the case when they are in an inverse relation. Accordingly, the semiconductor device can be made to be thinner.

Next, as indicated in FIG. 5(B), the second wire 50 is bonded to the second pad 22 and to the lead 34, in a similar manner as the bonding of the first wire 40. For example, a first bonding to the second pad 22 may be conducted, and a second bonding to the inner lead 36 may be conducted. In the first bonding, a ball 51 is formed on a tip portion of the second wire 50 in a manner described above, and the ball 51 is pressed against the second pad 22. When the first and second wires 40 and 50 are overlapped with each other and bonded, the ball 51 is pressed against a part of the first wire 40 on the second pad 22 to form a pump 52 on the first wire 40. By so doing, the bonded section of the first wire 40 and the second pad 22 can be enforced. When the position of the first bonding (for example, the position of the second pad 22) is lower than the position of the second bonding (for example, the position of the inner lead 36), the loop height of the second wire 50 can be made to be lower, compared to the case when they are in an inverse relationship. Accordingly, the semiconductor device can be made to be thinner. On the second pad 22, the first wire 40 does not form a standing portion that may rise from the bump 42. Therefore, even when the second wire 50 may be bonded on the first wire 40, the first wire 40 falls and can be prevented or substantially prevented from becoming short-circuited with other wires.

As an exemplary modification of the wire bonding process, as shown in FIGS. 6(A)–6(C), bumps 80 may be provided on the second pads 22, and a second bonding of the second wires 50 through the bumps 80 may be conducted. The bumps 80 may preferably be formed from the same material as that of the first wires 40, and may be, for example, gold. The bump 80 may be formed as follows. A ball is formed at a tip portion of a wire (not shown), the wire is torn off at a section near its tip portion to leave the ball on the second pad 22. Then, the bump 80 may be subject to a leveling to planarize its upper surface.

Alternatively, the bumps 80 may be formed by an electrolytic plating or an electroless plating. In this case, in the state of a semiconductor wafer, the bumps 80 may be formed all together. A surface layer of the bump 80 may preferably be formed from the same material as that of the first wire 40 (for example, gold). When the bumps 80 are formed by an electrolytic plating or an electroless plating, upper surfaces of the bumps 80 can be readily be planarized, such that the first wires 40 can be securely bonded to the bumps 80. Also, the second pads 22 are covered by the bumps (for example, gold bumps) 80. Therefore, even when the bonding position of the first wires (for example, gold wires) is somewhat shifted, they can be pressure-welded.

As indicated in FIG. 6(B), the second wires 50 may be bonded to the inner leads 36 in a first bonding, and to the second pads 22 in a second bonding. When the first and second wires 40 and 50 are overlapped with each other and bonded, the first and second wires 40 and 50 are bonded on the bump 80. In this case, as indicated in FIG. 6(C), the first and second wires 40 and 50 may be bonded to the bump 80 without forming any ball.

The wire bonding process is not limited to the examples described above, and is applicable to other structures which are consistent with the above-description.

After the wire bonding process is completed, a molding process is conducted. More particularly, the die pad 30 on which the first and second semiconductor chips 10 and 20 are mounted is set on a metal mold (not shown) for molding. The metal mold is formed of an upper mold and a lower mold. A recessed section is formed in each of the upper mold and the lower mold, where the recessed sections of both of the molds define a mold cavity. Sealing material (for example, thermosetting resin) is injected in the cavity to seal the first and second semiconductor chips 10 and 20, the first and second wires 40 and 50 and the inner leads 34.

Thereafter, a trimming process such as cutting bump burrs, a plating process, such as plating on the outer leads, a forming process and the like are conducted. Furthermore, other processes including a marking process and a testing process are conducted. The semiconductor device is manufactured via the processes described above.

The semiconductor device in accordance with the present embodiment includes structures that may derive from the manufacturing method described above. The same effects described above can be obtained from the method for manufacturing semiconductor devices.

(Second Embodiment)

Figure 7:
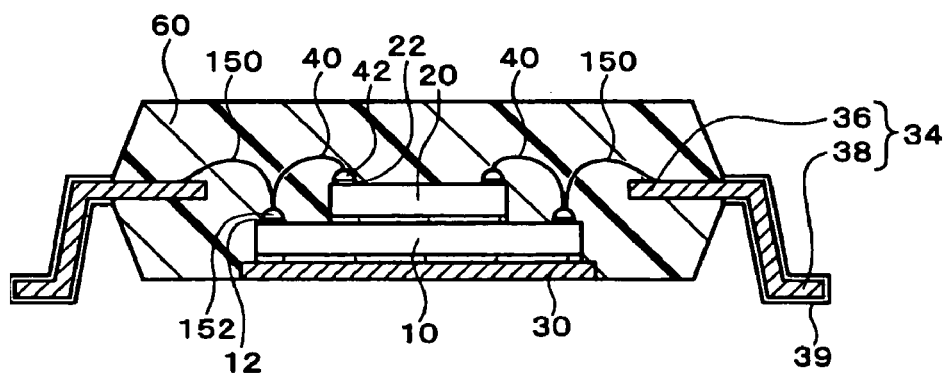
FIG. 7 is a schematic that shows a semiconductor device in accordance with a second embodiment of the present invention.

FIG. 7 shows a semiconductor device in accordance with a second embodiment of the present invention. In the present embodiment, first pads 12 and leads 34 (more specifically, inner leads 36) are electrically connected to one another by second wires 150. More specifically, one end section of the second wire 150 is bonded to the first pad 12, and the other end section of the second wire 150 is bonded to the lead 34. In this case, bumps 152 may be provided on the first pads 12, and the bumps 152 may be formed by squashed balls that are formed at tip portions of the second wires 150.

In accordance with the present embodiment, the first and second wires 40 and 150 do not overlap with one another except at the first pads 12 when viewed in a plan view of the first semiconductor chip 40. Therefore, the first and second wires 40 and 150 can be prevented or substantially prevented from becoming short-circuited.

As shown in FIG. 7, the first and second wires 40 and 150 may be overlapped and bonded to the first pad 12. In this case, the second wire 150 may be overlapped on the first wire 40, or the first wire 40 may be overlapped on the second wire 150.

In the semiconductor device and its manufacturing method, the contents described in the first embodiment are applicable to the other structures and effects.

Figure 8:
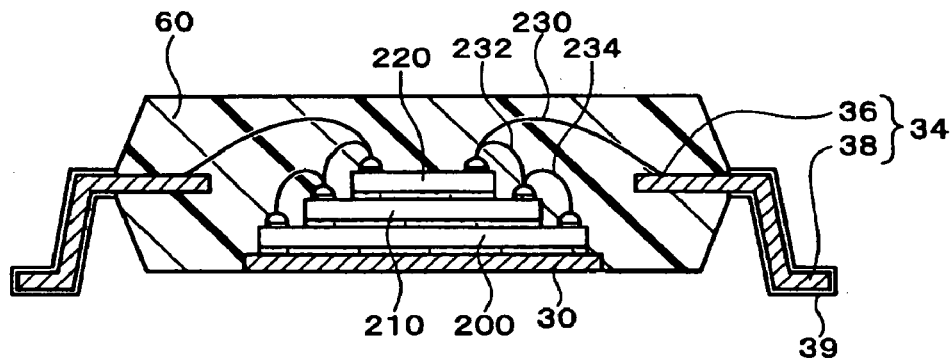
FIG. 8 is a schematic that shows a semiconductor device in accordance with a third embodiment of the present invention.

FIG. 8 shows a semiconductor device in accordance with a third embodiment of the present invention. In the present embodiment, three semiconductor chips 200, 210 and 220 are stacked in layers on a die pad 30. In this case, the first and second semiconductor chips described in the aforementioned embodiments correspond to two of the three semiconductor chips 200, 210 and 220.

In FIG. 8, pads on the semiconductor chip 220 in the uppermost layer and leads 34 are electrically connected to one another by wires 230. Also, the pads on the semiconductor chip 220 in the uppermost layer and pads on the semiconductor chip 210 in the intermediate layer are electrically connected to one another by wires 232. In this case, the semiconductor chip 210 in the intermediate layer may be defined as a first semiconductor chip, the semiconductor chip 220 in the uppermost layer as a second semiconductor chip, the wires 232 as first wires, and the wires 230 as second wires, and the contents explained in the embodiments described above can be applied as much as possible. The pads on the semiconductor chip 210 in the intermediate layer and pads on the semiconductor chip 200 in the lowermost layer are electrically connected to one another by wires 234.

Figure 9:
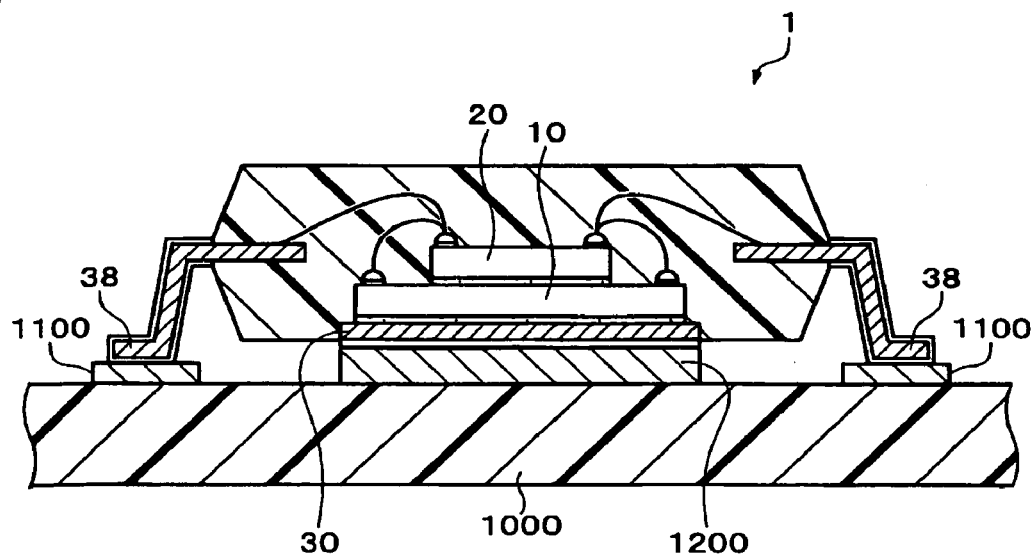
FIG. 9 is a schematic that shows a circuit substrate on which a semiconductor device in accordance with an embodiment of the present invention is mounted.

FIG. 9 shows a circuit substrate on which a semiconductor device in accordance with the present invention is mounted. An organic substrate, such as, for example, a glass epoxy substrate can be generally used as a circuit substrate 1000. Wiring patterns 1100 formed of, for example, copper or the like are formed into a desired circuit on the circuit substrate 1000. The wiring patterns 1100 and outer leads 38 of the semiconductor device 1 are bonded to one another. Also, a heat radiation member (heat spreader) 1200 is provided on the circuit substrate 1000, where the heat radiation member 1200 is bonded to an exposed surface of the semiconductor device 1. By so doing, heat generated in the first and second semiconductor chips 10 and 20 can be emanated, through the die pad 30, from the heat radiating member 1200.

Figure 10:
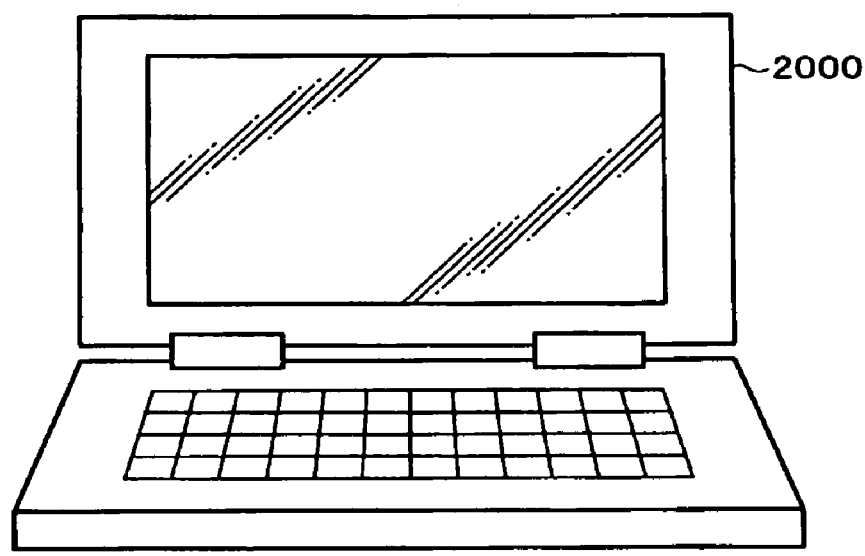
FIG. 10 is a perspective view that shows an electronic apparatus in accordance with an embodiment of the present invention.
Figure 11:
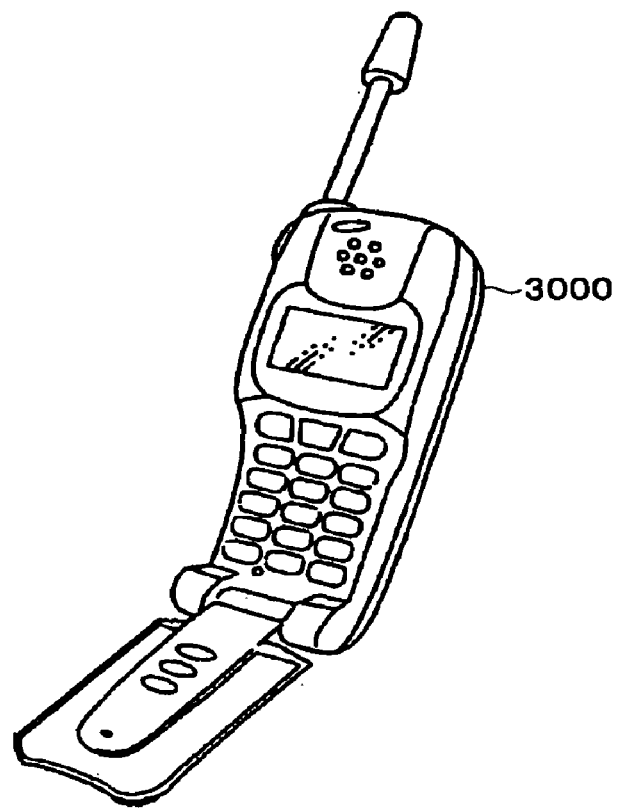
FIG. 11 is a perspective view that shows an electronic apparatus in accordance with an embodiment of the present invention.

FIG. 10 shows a notebook type personal computer 2000, and FIG. 11 shows a mobile telephone 3000, as electronic apparatuses that include semiconductor devices to which the present invention is applied.

The present invention is not limited to the embodiments described above, and many modification can be made. For example, the present invention may include compositions that are substantially the same as the compositions described in the embodiments (for example, a composition that has the same functions, the same methods and the results, or a composition that have the same objects and results). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include currently known or later developed technology added to the compositions described in the embodiments.

What is claimed is:

1. A semiconductor device, comprising:
   a die pad;
   a plurality of semiconductor chips stacked on one surface of the die pad, the plurality of semiconductor chips including a first semiconductor chip and a second semiconductor chip;
   a first pad formed on the first semiconductor chip;
   a second pad formed on the second semiconductor chip;
   a third pad formed on the second semiconductor chip and electrically connected to the second pad by a wiring formed on the second semiconductor chip;
   a lead extending toward the die pad, the lead being a separate element from the die pad;
   a first wire that is bonded to the first and second pad;
   a second wire that is bonded to the lead and to the third pad; and
   a sealing material that seals the plurality of semiconductor chips and exposes another surface of the die pad.

2. The semiconductor device according to claim 1, the second semiconductor chip being mounted on the first semiconductor chip.

3. The semiconductor device according to claim 2, the second wire being lead out to pass above the first wire.

4. The semiconductor device according to claim 2, the second wire being lead out to traverse the first wire.

5. The semiconductor device according to claim 2, the first semiconductor chip being a memory, and the second semiconductor chip being a microprocessor.

6. An electronic device, comprising:
   the semiconductor device according to claim 1.

* * * * *